United States Patent [19]

Germer et al.

[11] 4,166,975

[45] Sep. 4, 1979

[54] MULTIPLE RATE ELECTRICAL ENERGY METERING SYSTEM AND METHOD

[75] Inventors: Warren R. Germer, Rochester; Ansell W. Palmer, Hampton, both of N.H.

[73] Assignee: General Electric Company, Somersworth, N.H.

[21] Appl. No.: 797,935

[22] Filed: May 18, 1977

Related U.S. Application Data

[62] Division of Ser. No. 724,041, Sep. 17, 1976, Pat. No. 4,050,020.

[51] Int. Cl.² .................. G01R 15/08; G06F 15/20
[52] U.S. Cl. .................................. 324/116; 364/483
[58] Field of Search ................ 324/116; 307/293; 328/75; 58/33; 364/483, 492, 493

[56] References Cited

U.S. PATENT DOCUMENTS

| | | | |
|---|---|---|---|
| 593,852 | 11/1897 | Oxley | 324/116 |
| 2,132,256 | 10/1938 | Cameron | 324/116 |
| 2,139,821 | 12/1938 | Greenwood et al. | 324/116 |
| 2,246,185 | 6/1941 | Pratt | 324/116 |
| 2,295,349 | 9/1942 | Lenehan | 324/116 |
| 3,869,854 | 3/1975 | Church | 58/33 |
| 3,881,156 | 4/1975 | Deutsch | 328/75 |
| 4,031,693 | 6/1977 | Haag et al. | 58/33 |

Primary Examiner—Rudolph V. Rolinec
Assistant Examiner—Ernest F. Karlsen

Attorney, Agent, or Firm—Robert E. Brunson; Francis X. Doyle

[57] ABSTRACT

An electronic time-of-day metering system is disclosed for measuring electrical power by at least two different mechanical recording devices depending on the time-of-day and time of week in which the electrical power is being consumed. A conventional kilowatt hour meter includes a set of decade gear driven dials which register the kilowatt hours consumed on a continuous basis. At least one other set of decade gear driven dials is provided for registering the consumption of kilowatt hours during preselected peak power usage intervals. A single MOS integrated circuit controls the operation of the alternate set of decade gear driven dials. This circuit utilizes as its time base the 60 Hz line voltage derived from the energy distribution system being metered. A clock circuit generates timing signals for a clock control circuit which includes a circulatory memory which is preprogrammed to contain the times at which one or more alternate sets of dials are to be actuated. When the clock time equals a stored time a gating signal is generated. At the same time a function command signal, also stored in the circulatory memory, is passed through the enabled gate for engaging or disengaging the alternate set of decade gear drive dials, depending on the value of the function stored. The gated signal controls the energization of a bistable clutch which engages the alternate set of dials. A method for registering total energy consumed by a metered system as well as energy consumed during preselected time intervals is also disclosed.

9 Claims, 18 Drawing Figures

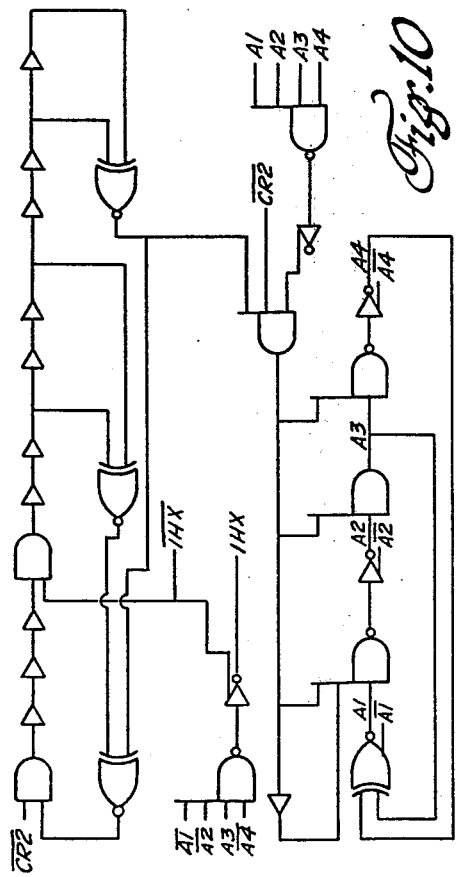
Fig. 10 (DIVIDE: 16 KHZ TO 1 Hz)
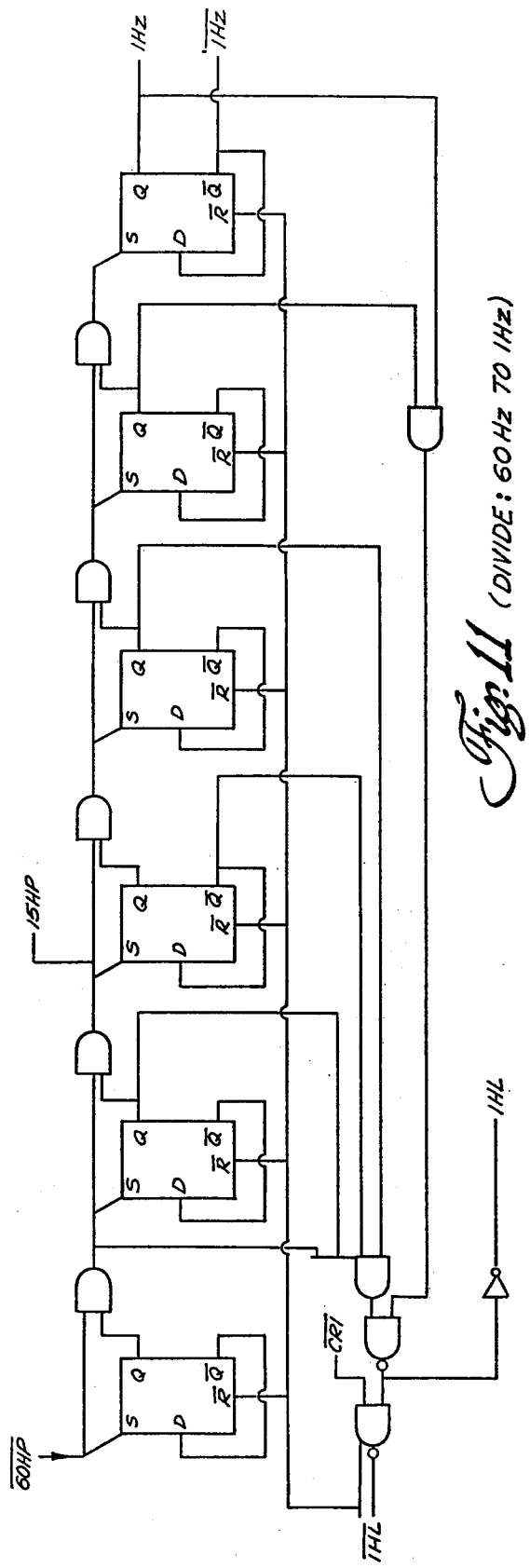
Fig. 11 (DIVIDE: 60 Hz TO 1 Hz)

MULTIPLE RATE ELECTRICAL ENERGY METERING SYSTEM AND METHOD

This is a division of application Ser. No. 724,041, filed Sept. 17, 1976, now U.S. Pat. No. 4,050,020.

BACKGROUND OF THE INVENTION

This invention relates to an improved method and apparatus for metering electricity at multiple rates depending upon the time of day and time of week during which consumption of electricity is being measured.

In electrical distribution systems, electrical energy has heretofore been sold quite generally on the basis of a fixed rate schedule irrespective of whether a high or low demand has been made upon the electrical generation system. Because of this, the electrical generation and distribution system has been found to be, at times, overloaded and, at other times, to be only very slightly loaded. This results in substantial inefficiencies since a much larger plant and distribution system than is economically desirable is required in order to meet peak demands of the distribution system.

In order to provide for more efficient use of electrical generation and distribution facilities during off-peak load periods, attempts have been made at developing clock mechanisms for decreasing the flow of electricity during peak load periods. Generally, in the past, these types of devices have been found to be impractical due to the necessity of frequent checking and setting of the clock switching mechanisms at the various consumers locations and, in addition, to the inability to predict peak demand load intervals and to change the timing of the clock mechanisms on a relatively simple and efficient basis to track the peak load intervals.

Very early in the supply of electricity over a relatively large distribution areas, attempts were made at multiple rate metering of electrical power consumption. As an example of a prior attempt to individually register different amounts of power consumed during different intervals of a day, Greenwood et al disclosed in U.S. Pat. No. 2,139,821 a simplified arrangement wherein a two-stage mechanical watt meter mechanism was provided having a clock timer associated therewith. Cams on the clock timer tripped a mechanism which, at selected times during the day, permitted the driving of one set of meter dials or the other so that consumption of electrical energy, during a selected portion of the day, could be registered by only one set of dials, while the electrical energy consumed during the other portion of the day could be registered on a second set of dials. This arrangement was followed by the developments of Pratt, as disclosed in U.S. Pat. No. 2,246,185 and Cameron, as disclosed in U.S. Pat. No. 2,132,256. The Pratt and Cameron developments both utilized dual rate metering systems wherein a clock determined which set of meters were to be activated. Other attempts have been made at providing a dual rate kilowatt hour metering system, as exemplified by the following patents: Barstow U.S. Pat. No. 548,419; Cox U.S. Pat. No. 585,258; Oxley U.S. Pat. No. 591,195; Oxley U.S. Pat. No. 593,852; Wilson U.S. Pat. No. 596,283; Kapp U.S. Pat. No. 597,985; Oxley U.S. Pat. No. 710,070; Mayer U.S. Pat. No. 1,078,206; Ogurkowski U.S. Pat. No. 2,415,653; and Kahn U.S. Pat. No. 2,915,704.

In addition to the aforementioned two-rate mechanical registering systems, other systems have been developed wherein the use of power above a certain level is recorded. This excess consumption does not relate to time-of-day metering, but rather is a proposed means of reducing the peak use of power by a particular customer. Such systems minimize individual peak power usage which may or may not coincide with the peak power demand on a utility system. It is a purpose of the present invention to provide a system for individually measuring the consumption of power from an electrical generation and distribution system during the peak demand intervals of the system in order to encourage consumers of electrical power to shift consumption of power to off-peak intervals.

In view of the aforementioned, it is an object of this invention to provide an improved method and apparatus for measuring and displaying electrical power consumption on different meter displays depending upon the time of day and time of week during which the power is being consumed.

SUMMARY OF THE INVENTION

Accordingly, this invention relates to a method and apparatus for measuring electrical power by at least two different mechanical recording devices depending on the time of day and time of week in which the electrical power is being consumed. A mechanical kilowatt hour (KWH) meter having a conventional set of decade gear driven dials register the kilowatt hours consumed on a continuous basis. At least one other set of decade gear driven dials, hereinafter designated alternate rate dials, are provided for registering the consumption of KWH's during preselected peak power usage intervals. The peak power demand intervals may vary from day to day and from hour to hour and, accordingly, a programmable logic control circuit is provided for selectively driving at least one set of alternate rate dials. The programmable timing circuit utilizes as its time base the 60 Hz frequency derived from the energy distribution system being metered. A clock circuit is provided for generating time in 15-minute increments on a weekly cycle. The output of the clock circuit is coupled to the logic control circuit as one input thereof. The logic control circuit includes a circulatory memory which is preprogrammed to contain the times at which the alternate rate set of dials are to be actuated. When the clock time equals a stored time, an output gate to the alternate rate dial drive is enabled. A function command signal, also stored in the circulatory memory, is passed through the enabled gate for engaging or disengaging at least one alternate rate set of decade gear driven dials depending on the value of the function. Thus, the alternate rate set of dials can be selectively driven to show the consumption of electrical power during selected intervals, which intervals may vary from day to day dependent upon the day of the week.

BRIEF DESCRIPTION OF THE DRAWINGS

Other objects, features and advantages of the present invention will become more fully apparent from the following detailed description of the preferred embodiment, the appended claims and the accompanying drawings in which:

FIGS. 10, 11 and 12 are schematic diagrams, of a portion of the clock timer circuits of the present invention.

DESCRIPTION OF THE PREFERRED EMBODIMENT

At the outset, it should be understood that in the preferred embodiment two alternate rate sets of decade gear driven dials are included in the mechanical portion of the KWH register of the present invention. As illustrated in FIG. 2, one set is positioned above and one set is positioned below a conventional set of five dials which continually register KWH in the same manner as that of standard five-dial pointer registers. Either set of alternate rate dials can be engaged to indicate consumption of power, or disengaged so that no consumption of power is registered therein, as determined by the control circuit illustrated in FIG. 1. When engaged, either set of alternate rate dials accumulates and displays the consumption of power at the same rate as the conventional set of dials. When disengaged, the alternate rate dials remain fixed at their last reading until again engaged. The purpose of having the two alternate rate sets of dials is to provide utilities with a three-level rate structure if desired, i.e., total power usage, a first alternate rate usage and a second alternate rate usage.

Figure 1:
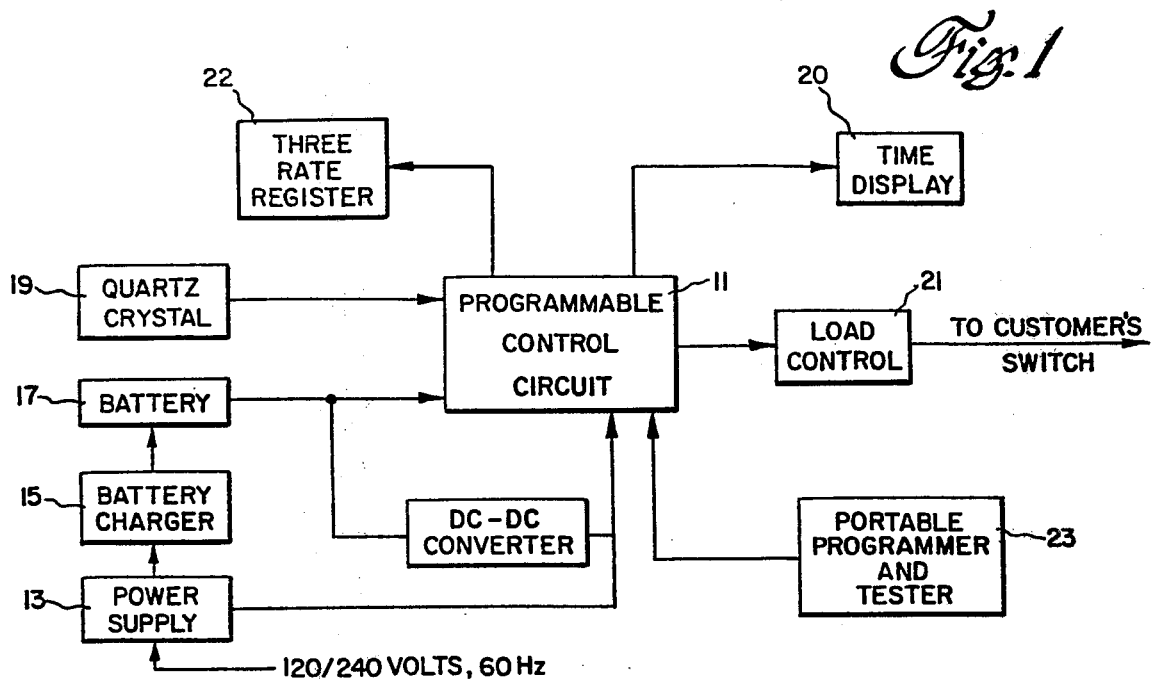
FIG. 1 is a schematic block diagram of the time of day metering system of the present invention.
Figure 2:
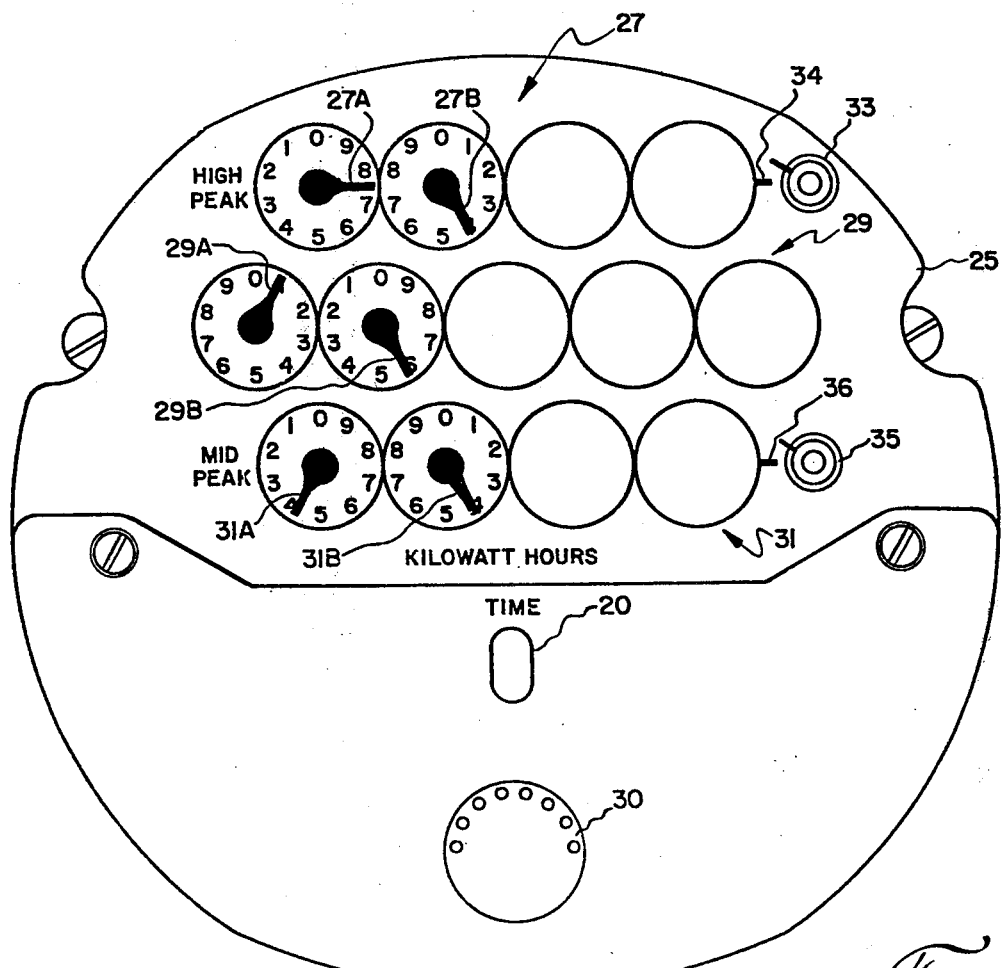
FIG. 2 is a front view of a preferred mechanical three-rate register of the present invention.

With specific reference to FIG. 1, a programmable control circuit 11 is provided which generates timing signals for selectively engaging the alternate rate drive gears with the drive train for the conventional set of five dials. The programmable control circuit 11 is energized from the 60 Hz power line via power supply 13. A battery charger 15 is provided which charges a rechargeable battery 17 so that, should a power outage occur, the timing function of the programmable control circuit 11 will continue to be operable. In addition to providing power to the programmable control circuit, the 60 Hz input to the power supply 13 is utilized as a time base for the programmable control circuit 11. As will be more fully explained hereinbelow, should a power outage occur, a quartz crystal 19 is provided which will act as an alternate time base for the control circuit 11.

The programmable control circuit 11 includes a timer in the form of a 7-day clock which performs the timing functions which engage and disengage the drive gears for the alternate rate sets of dials. The output of the 7-day clock is resolved into 15-minute intervals, with each output being capable of controlling one or more timed functions at any one of the 15-minute intervals. As an example, a single signal from the 7-day clock can control disengagement of one alternate rate set of dials, engagement of a second set of dials and, if desired, switch on or off a load control circuit 21. On a 7-day basis, the control circuit 11 can be programmed to enable or inhibit the operation of one or both of the alternate rate registers and the load control circuit 21 at any time during the 7 days. The timer also drives a single digit time display 20 which will be described in greater detail hereinbelow. The time controlled output of the control circuit 11 is coupled to a register 22, which displays the total electrical power consumed as well as the electrical energy consumed during predetermined peak load intervals as determined by the control circuit 11.

The timer circuitry 11 is programmed electronically by means of a portable programmer and tester circuit 23 which is disclosed in General Electric Company patent docket number 21-ME-26-W. Germer on which copending application Ser. No. 724,040, filed Sept. 17, 1976, now U.S. Pat. No. 4,093,997, was filed on even date herewith and assigned to the common assignee herewith. The portable programmer and tester 23 is connected by a plug-in electrical connector through a locked or sealed opening in the meter enclosure. The programmer and tester contains its own battery operated power supply, a quartz crystal controlled 7-day clock and appropriate circuitry for testing, reprogramming and setting the time of the time of day metering system of the present invention.

Referring now to FIG. 2 which is an illustration of the meter display of the present invention, it will be seen that the meter includes a meter register assembly having a face plate 25 with three sets of dials 27, 29 and 31, and associated indicating dial pointers 27A, 27B, 29A, 29B, 31A and 31B, etc., rotatably mounted relative thereto. The center row of dials 29 is the standard Kilowatt hour (KWH) display, while the lower set of dials 31 is an alternate rate set of dials corresponding to a second alternate power rate schedule. The upper set of dials 27 is a first alternate rate set of dials corresponding to a first alternate rate schedule. To the side of each set of alternate rate dials is a pointer, 33 and 35, respectively. These pointers are rotated into alignment with markers 34 and 36, respectively, when the corresponding set of alternate rate dials is engaged to register the consumption of power within the system being monitored. In the positions of pointers 33 and 35 illustrated in FIG. 2, neither alternate rate set of dials is being driven to register the consumption of electrical power. Also illustrated in FIG. 2 is a single digit clock display 20 which illustrates sequentially in numerical form the day of the week, the hour and the minutes of the hour in five minute increments. The operation of the clock display will be explained more fully hereinbelow. Finally, a multiple contact, socket-type connector 30 is positioned such that a cooperating, multiple pronged plug from the portable programmer and tester 23 can be readily inserted therein. A lock or seal (not shown) is preferably provided to selectively prevent unauthorized access to the connector 30.

Figure 3:
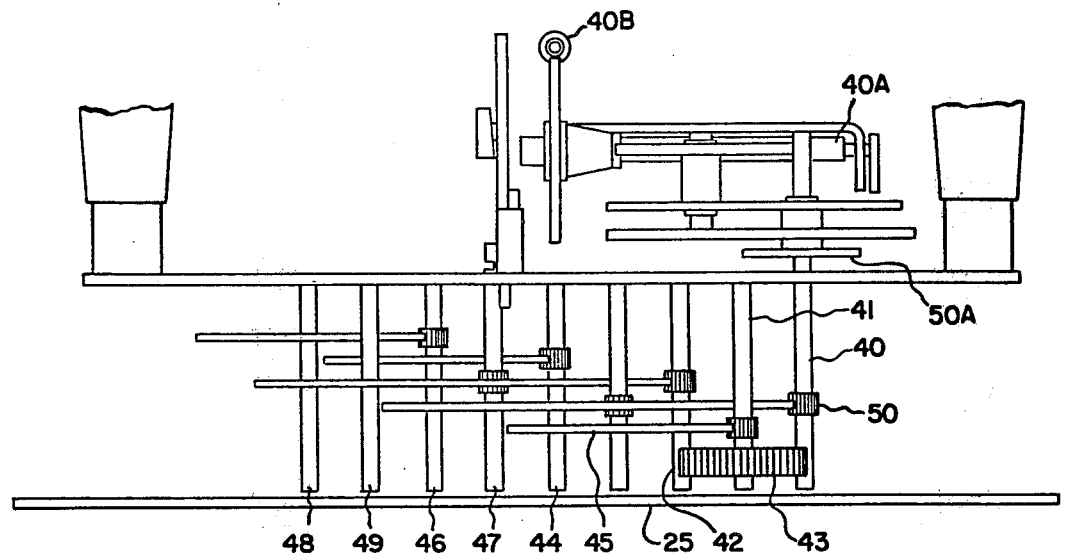
FIG. 3 is a top view of the drive train for the standard kilowatt hour meter set of dials.

Referring now to FIG. 3 it will be seen there is illustrated a top view of the drive train for driving the sets of dial pointers 27A, et cetera. The drive train for these pointers are of conventional design known in the art with the least significant drive shaft 40 being driven by worm gear 40A, which in turn is rotated by the power that drives the meter disc shaft 40B. The shafts 42, 44, 46 and 48 and the gear train mounted thereon are associated with the set of dials 29 that are driven by gears in a conventional manner from continuously meshed input drive gear 50 on drive shaft 40. Alternate shaft 41 is provided with a drive gear 43 which drives the upper set of alternate dial pointers associated with dials 27, by means of shafts 41, 45, 47 and 49 and the second dial pointer drive gear train associated therewith. The gear 43 is driven only when a clutch mechanism described hereinbelow is engaged by means of the control circuit 11. A similar drive arrangement is established for the lower set of alternate dials 31, its associated dial pointers 31A, 31B, etc., and their drive gear train 31A', (shown in FIG. 4).

Figure 4:
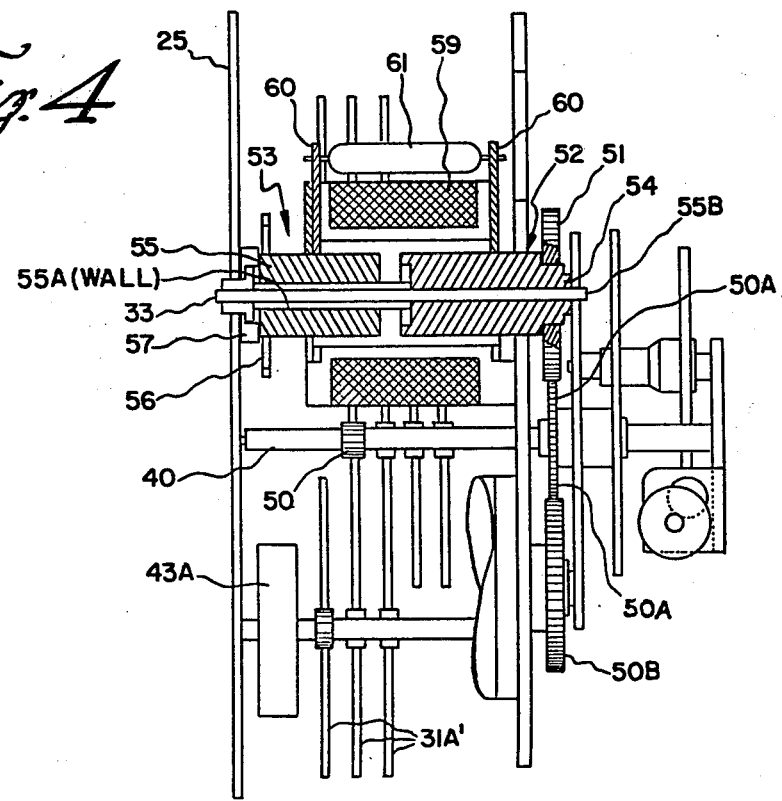
FIG. 4 is a partial section view of the clutch mechanism for driving one of the alternate rate set of dials.

Referring now to FIG. 4 there is shown the clutch and drive arrangement for the dial pointers of dials 27, 29 and 31. The shaft 40 is illustrated connected to the meter drive. Accordingly, shaft 40 continuously drives input drive gear 50 that is staked onto it. The drive gear 50A is in continuous meshing engagement with a first clutch idler gear 51 and a second clutch idler gear 50B, thus gear 50A drives the first idler assembly 52 by means of first idler gear 51. The first idler assembly includes a soft iron core 54 which is fixed to the gear 51 by being staked or otherwise suitably fastened thereto. A movable clutch and brake assembly generally designated by the numeral 53 is mounted in juxtaposition to the first idler assembly 52 and includes a generally cylindrical permanent magnet 55 and a first clutch gear 56 secured in fixed relationship to the magnet.

First clutch and brake assembly 53 is arranged so part of its generally cylindrical magnet 55 is provided with wall means 55A defining a passageway through its longitudinal axis. A first shaft 55B is positioned in the passageway and is rotatably mounted in the face plate 25 and any suitable frame member of the meter. Thus, the first clutch and brake assembly is mounted coaxially on the first shaft 55B for reciprocal sliding relationship with respect thereto. The magnet 55 is magnetically polarized in the axial direction relative to shaft 55B so that it cooperates with the magnetic field induced in the soft iron core 54 of the idler assembly 52 and solenoid coil 59 to attract the magnet 55 to the core 54 when a magnetic field is induced in a first direction in the soft iron core by the first solenoid coil 59 mounted adjacent to and in at least partial surrounding relationship with the first idler assembly and first clutch and brake assembly. To repel the magnet away from the soft iron core, a second magnetic field is induced in the opposite direction therein. In the position illustrated, the permanent magnet 55 is attracted to a brake member 57 which is in the form of a soft iron plate to thereby hold the upper set of dial pointers 27A, 27B, etc., at a fixed or braked position. Alternatively, when the permanent magnet 55 is moved to the right, it is attracted to the soft iron idler assembly 52 with which it becomes engaged to cause the upper set of dial pointers 27A, 27B., etc., to be driven through the first magnetic clutch idler gear assembly 52 and the first clutch gear assembly 53 and first clutch gear 56. The clutch gear 56 is always in engagement with a relatively wide gear 43 (shown in FIG. 3 and FIG. 5) for driving the upper set of dial pointers 27A, 27B, etc., as it slides back and forth in its meshing engagement. This arrangement reduces error and increases the longevity of the gears.

Figure 5:
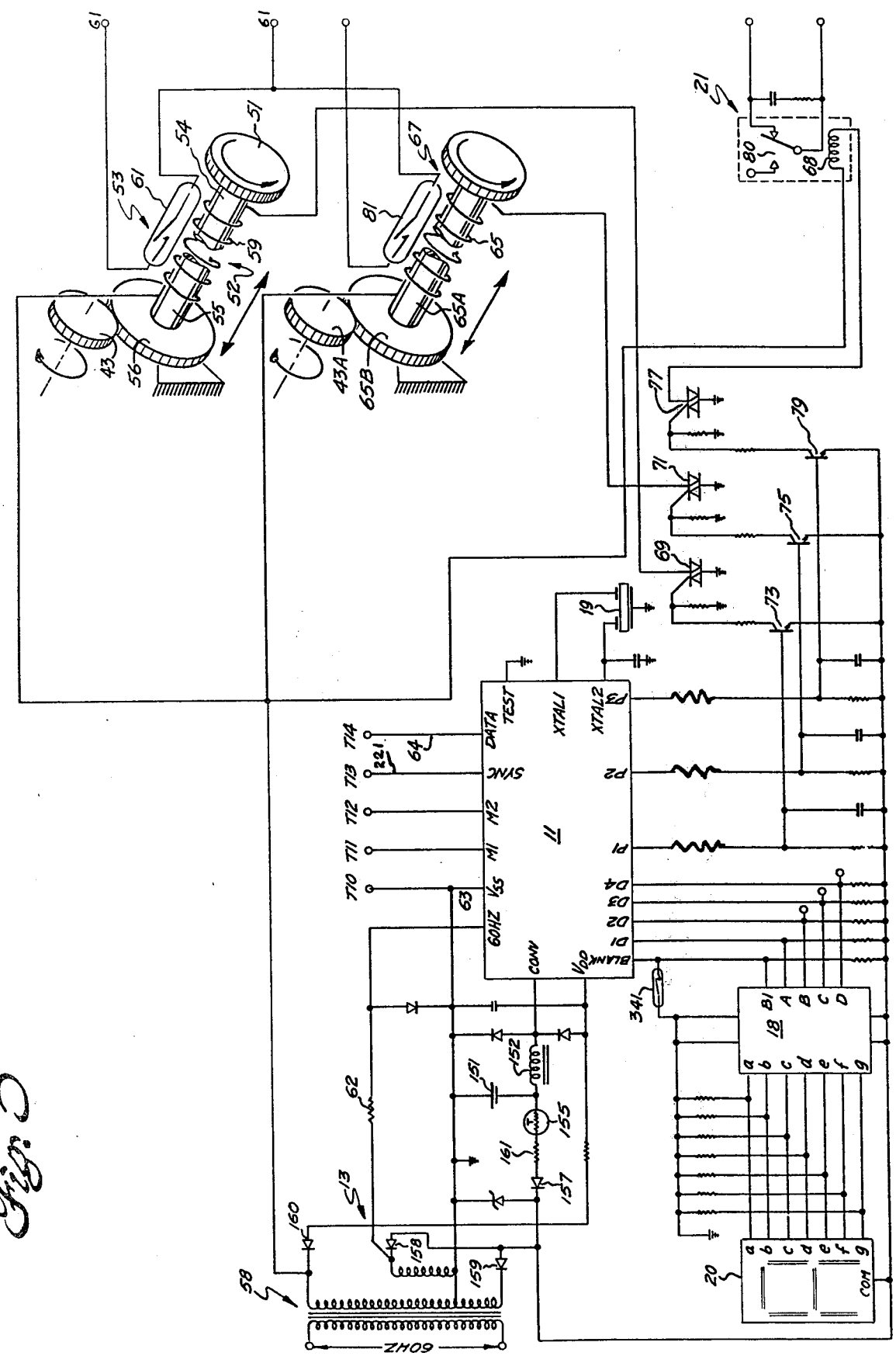
FIG. 5 is a schematic diagram of the time of day metering system.

Advantageously, both the first and second movable clutch assemblies and bistable devices, so they will remain in either a braked or a clutched postion after being moved to either position by the action of solenoid coils 59 and 65 (shown in FIG. 5). Thus, relative to the first clutch assembly associated with dial 27, energy need only be supplied to the first solenoid coil 59 to set the clutch in a desired position, after which energy need not be supplied to the solenoid clutch to maintain the clutch in a designated position. Consequently, when energized with direct current so as to attract the magnet to the soft iron core 54, the first clutch gear assembly 53 remains engaged and the upper set of alternate rate dial pointers 27A, 28B, etc., are driven. When the first solenoid coil 59 is energized in the opposite direction, a magnetic field is generated in the soft iron core 54 and in solenoid coil 59 which repels the permanent magnet 55 in the opposite direction to disengage the upper alternate rate set of dial pointers 27A, 27B, et cetera. When repelled, the permanent magnet is attracted to the brake member 57 which holds the dial pointers in a fixed or braked position.

A first switch means, which in the preferred form of the invention is a reed switch 61, is mounted to the first solenoid 59, and is a single pole, single throw, normally open type switch. This switch can be connected to a variety of load means but in this form of the invention is connected to a first indicating signal means (via terminals 61A and 61B, shown in FIG. 5) in the form of a suitable customer rate indicator light (not shown) positioned at some suitable location within the facility, such as a home, to which the meter is applied. The switch 61 is mounted in the magnetic field produced by first solenoid coil 59, thus it is responsive to movement of the first clutch and brake assembly 53 to indicate the relative position thereof.

The magnetic circuit created by the first permanent magnet 55, the first idler gear assembly 52, the iron keepers 60 which support the idler and magnets, and the reed switch itself, create a magnetic path for maintaining the state of the reed switch 61. With the first clutch engaged, the air gap between the magnet 55 and the idler gear assembly 52 is substantially eliminated and, accordingly, the reed switch is held closed because of the increased magnetic field due to the low reluctance of the magnetic circuit. Alternatively, when the magnet 55 is in its braked position, as illustrated, the air gap between the magnet 55 and the idler gear assembly 52 increases thereby to increase the reluctance of the magnetic path. Consequently, the reed switch 61 is opened due to the reduced magnetic attraction on the switch contacts. When the reed switch 61 is closed, the customer rate indicator light is energized, indicating that the set of dials 27 is registering the consumption of power and that, accordingly, power is being consumed at one of the alternate rates. It will be understood that a similar clutch drive assembly having components corresponding to those just described relative to the dials 27 is provided for driving the set of dial pointers 31A, 31B, et cetera. This second clutch drive and brake assembly arrangement is schematically illustrated in FIG. 5.

Referring now to FIG. 5, there is shown a more detailed schematic block diagram of the metering system of the present invention. The programmable controller 11 is in the form of a single MOS integrated circuit which utilizes two phase dynamic ratioless logic. The specific circuitry of the programmable control circuit 11 will be discussed more specifically hereinbelow. A quartz crystal 19 is connected to the control circuit 11 to drive an oscillator circuit therein for providing a continuous time base for controlling the synchronization of the controller 11 as well as a source of sync signals via output line 64 for synchronizing a time setting and reprogramming means for the metering system. A detailed description of the oscillator is disclosed in copending application Ser. No. 707,275, now U.S. Pat. No. 4,048,590 filed July 21, 1976 and assigned to the common assignee herewith and is illustrated schematically in FIG. 9.

A power supply circuit is shown which is generally designated by the numeral 13. The power supply includes a transformer 58 for transforming the line current of the power distribution system. A 60 Hz AC signal, preferably having an amplitude of 7.5 volts, is coupled via resistor 62 to the time base input 63 of the controller circuit 11. This signal provides the time base for driving the timer circuits of the controller 11 under normal operating conditions. As will be seen hereinbelow, should a fault condition exist, the output of the quartz crystal oscillator circuit including crystal 19 will provide the time base for the clock timer in the controller circuit 11. Power from the power supply in the form of a full wave rectified unfiltered voltage is provided by diodes 158 and 159. This voltage drives a single digit time display 20, a display driver decoder circuit 18 which is of conventional design known in the art and the Triac drive circuits which include transistors 73, 75 and 79. The full wave rectified voltage also is coupled to a battery charging circuit which includes diode 157, thermistor 155 and a resistor 161. By utilizing an unfiltered power supply voltage for driving the time display 20, the decoder driver 21 and the Triac drive circuits, the necessity for a relatively large filter capacitor is obviated thereby increasing the reliability of the circuit and decreasing the size thereof so that the entire time-of-day metering system can be positioned within a mechanical metering housing of usual KWH meter size.

A half-wave rectified voltage is provided by means of diode 160 which is coupled to input $V_{DD}$ of the control circuit 11. A battery powered carry-over voltage supply circuit is provided of the type disclosed in copending application Ser. No. 707,278 filed July 21, 1976, now U.S. Pat. No. 4,093,909, and assigned to the common assignee herewith. An AC voltage, preferably having an amplitude of 50 volts, is coupled to the solenoid 59 for the clutch gear assembly 53 for driving the alternate set of dial pointers 27A, 27B, etc., and to the solenoid 65 of the clutch mechanism 67 for driving the second set of alternate dial pointers 31A, 31B, et cetera. Current flow through solenoid coil 59 is controlled by means of a Triac 69 and current flow through solenoid coil 65 is controlled by Triac 71. Triacs 69 and 71 are in turn controlled by the output of the controller circuit 11 via transistors 73 and 75, respectively. Current from the transformer 58 is also coupled to a solenoid winding 68 via Triac 77. Triac 77 in turn is controlled by means of the controller circuit 11 via transistor 79. When solenoid 68 is energized, relay arm 80 rotates to the left thereby opening a circuit to a predetermined load. Thus, depending upon the program stored in the controller 11, load control circuit 80 is operated to actuate or deactuate a particular load to which power from the distribution system flows.

As aforementioned in connection with the discussion of the clutch mechanism illustrated in FIG. 4, when the solenoid coil 59 is energized to engage the first clutch gear assembly 53, reed switch 61 is closed to thereby provide a voltage to a light display on the premises to indicate that the alternate rate dial set 27 is recording the consumption of electricity. A second reed switch 81 is closed when solenoid 65 is energized to thereby indicate that the second alternate set of dials 31 are recording the consumption of electricity.

Figure 6A:
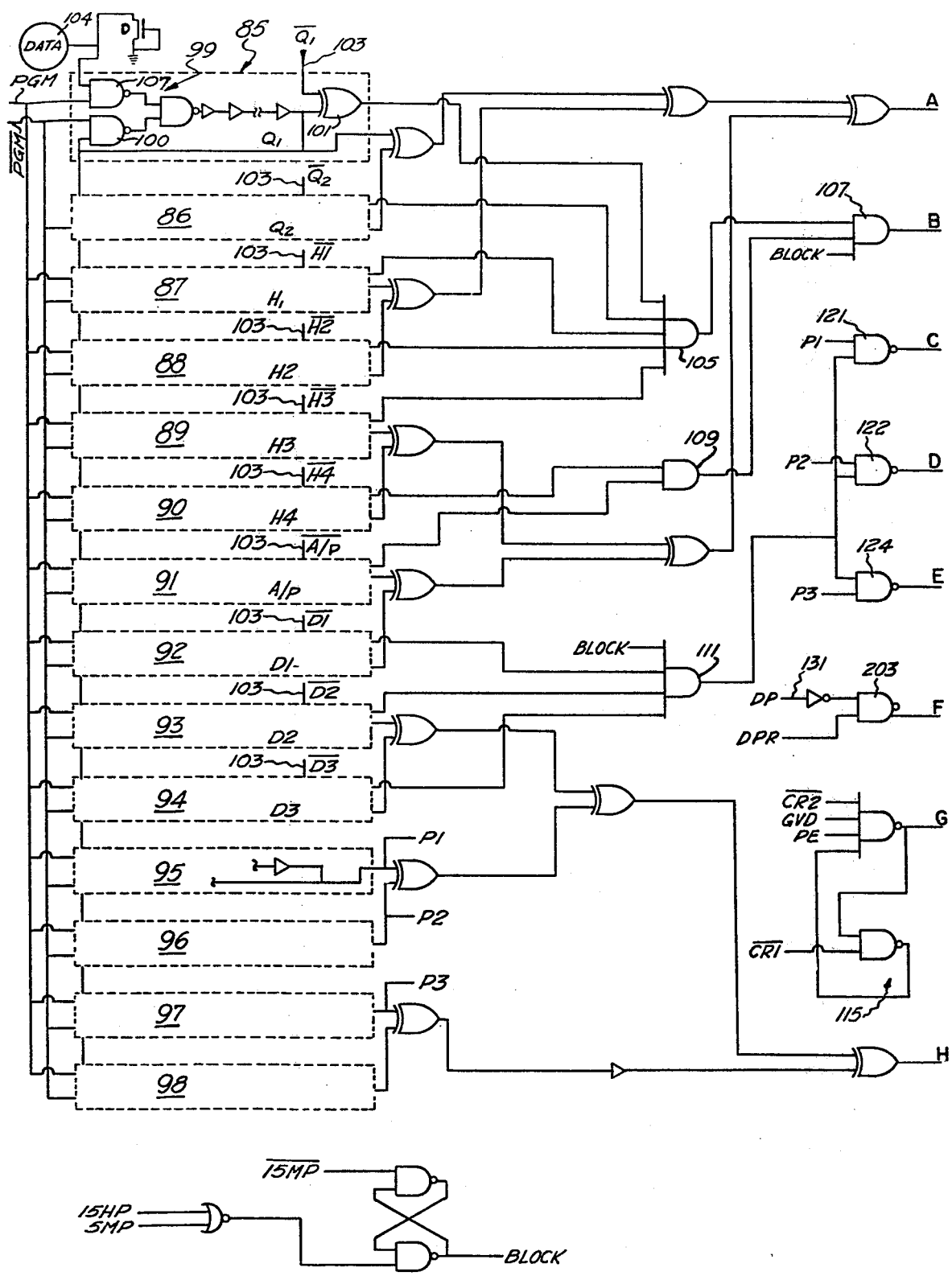
FIGS. 6A and 6B are schematic diagrams of the program memory control circuit of the present invention.
Figure 6B:
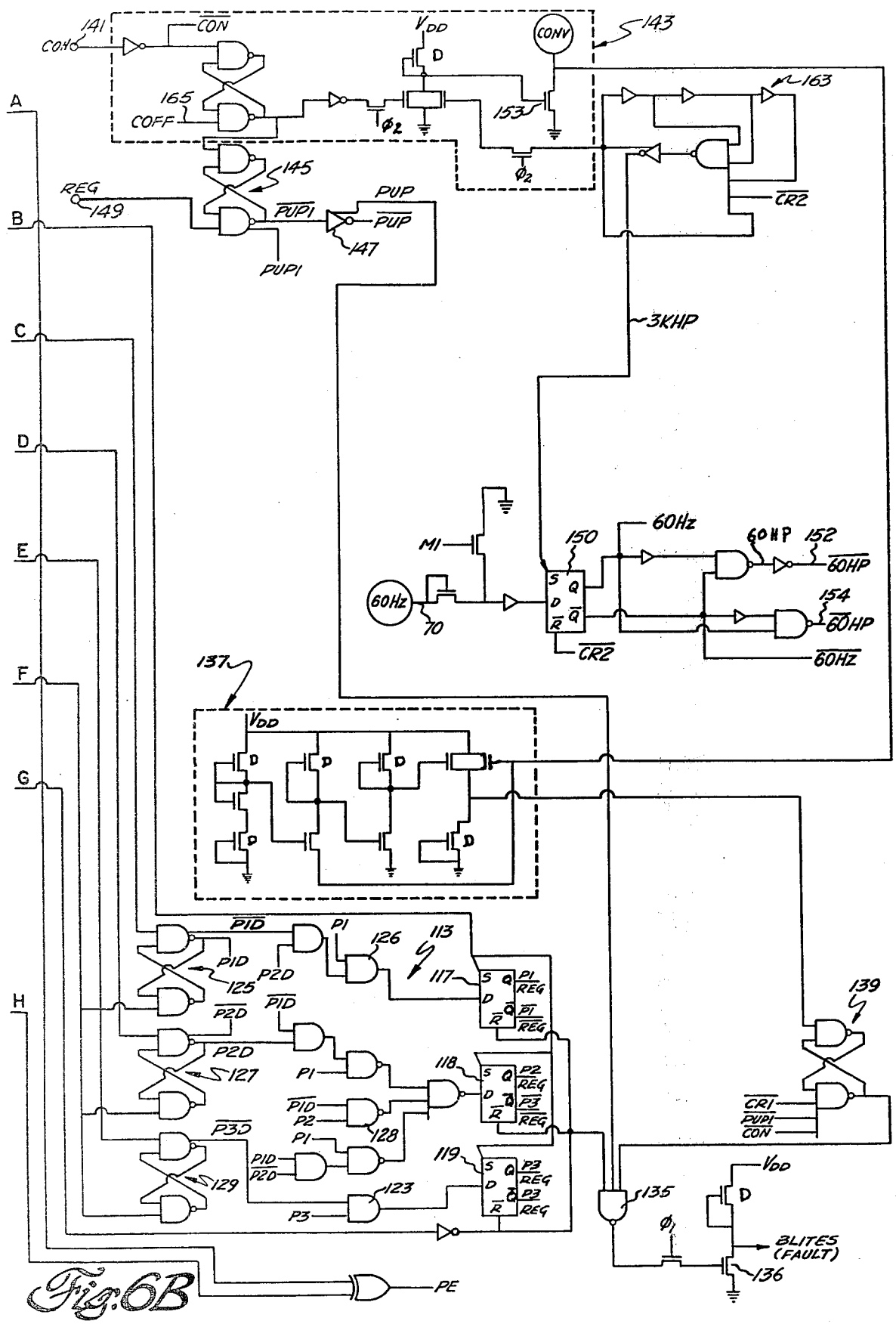

Refer now to FIGS. 6A and 6B which are schematic illustrations of the program memory control circuit of the present invention. Illustrated in FIG. 6A are fourteen recirculating shift registers 85–98 which form the memory of the control circuit. These shift registers are of conventional design and each include a gating arrangement 99 at the input thereof for controlling the reprogramming of the shift registers under the control of program signals PGM and $\overline{PGM}$. The last stage of each shift register is connected back to the input thereof and, except for register 98, the last stage of each shift register is connected to the input of the next succeeding shift register so that during the normal operation of the program memory circuit, i.e., when a gate 100 is enabled by the $\overline{PGM}$ signal, the data in each shift register recirculates. When the NAND gate 102 in each register is enabled by the PGM signal, input data from terminal 104 passes in a sequential train through each of the shift registers to thereby permit the reprogramming of the memory of the controller.

At the output of each of the shift registers 85–94 is a comparison circuit 101 in the form of an EXCLUSIVE OR gate which provides an output which is high or a logical "1" when the time code signal from the last stage of each of the shift registers is the same as the time code signal on the input lines 103. It should be understood that since EXCLUSIVE OR gates are utilized for comparing the time code signals, each bit of the time code stored in the memory will be the inverse of the time code on the input lines 103 when a comparison exists.

As will be discussed more fully hereinbelow the timing signals appearing on lines 103 define the real time of the day and week. Thus, the $\overline{Q}_1$ and $\overline{Q}_2$ inputs on lines 103 to shift registers 85 and 86 define four 15 minute segments within the hour of each day. The $\overline{H1}$-$\overline{H4}$ inputs on lines 103 to shift registers 87–90 define each hour in a 12 hour portion of a day. The $\overline{A/P}$ input to shift register 91 defines the 12 hour segments of a day, i.e., the a.m. or the p.m. Finally, the $\overline{D1}$-$\overline{D3}$ inputs to shift registers 92–94 define the day of the week.

The outputs of the comparison circuits in each of the recirculating memories 85–89 are connected to the input of an AND gate 105. The output of AND gate 105 is connected to one input of a second AND gate 107. The outputs of the comparison circuits in recirculating memories 90 and 91 are connected to AND gate 109, the output of which is connected to a second input of AND gate 107. The third input to AND gate 107 is a BLOCK signal derived from the clock timer of the present invention which signal goes high at the beginning of each 15 minute segment of each hour of the day. The block signals inhibit comparator circuits 107 and 111 when the clock timer goes through a change of state, i.e., at each 15 minute time change. This insures against an improper situation of the clutches and the load control switch of the present invention. AND gate 107 provides a high output when there is a coincidence of the time code signals as defined by the inputs $\overline{Q_1}$, $\overline{Q_2}$, $\overline{H1}$-$\overline{H4}$ and $\overline{A/P}$, with the data stored in the recirculating shift registers 85-91. This signal provides a clock input to each of the function control flip-flops 117, 118 and 119 illustrated in FIG. 6B. Thus, a high signal at the output of AND gate 107 in effect enables flip-flops 117-119 to receive function control signals which will be explained more fully hereinbelow.

The output of the comparison circuits in shift registers 92-94 are each connected to AND gate 111. Also connected to AND gate 111 is the BLOCK signal which was previously described. The output of AND gate 111 is connected to one input of each of three NAND gates 121, 122 and 124. Thus, upon the coincidence of the signals $\overline{D1}$-$\overline{D3}$ which define the day of the week with the time code stored in the shift registers 92-94, an output will be provided for enabling NAND gates 121, 122 and 124.

Shift registers 95, 96 and 97 each store function control signals which, taken either singly or in combination, define what action is to be taken with respect to the operation of the bistable clutches and the load control switch. Finally, shift register 98 stores parity bits.

If, for example, an action is to take place at the time defined by the time code signal stored in shift registers 85-91, function control flip-flops 117, 118 and 119 are clocked thereby providing an output in accordance with the input at the D terminals thereof. Without a time coincidence signal at the output of AND gate 111, AND gate 126, NAND gate 128 and AND gate 123 are enabled to thereby couple the output of the last stages of the shift registers 95-97, i.e., P1, P2 and P3, respectively, to the inputs of the flip-flops 117-119. Thus, flip-flops 117-119 provide outputs which define either a clutch switching operation or a load control switching operation to be performed. When, however, there is time coincidence signal at the output of AND gate 111 indicating that at some particular day of the week one or more switching operations are to occur at different times NAND gates 121, 122 and 124 are enabled. Consequently, the function control output signals P1, P2 and P3 from shift registers 95-97 are coupled via gates 121, 122 and 124 to latch circuits 125, 127 and 129, respectively. Depending upon the content of the signals P1, P2 and P3, one or more of the latch circuits 125, 127 and 129 will be set. When, for example, latch circuit 129 is set, AND gate 123 is inhibited to thereby prevent operation of the load control switch which is controlled by the output of function control flip-flop 119. The manner in which flip-flops 117 and 118 are controlled is defined by the logic circuitry generally designated by the numeral 113. To simplify the discussion of the operation of the logic cirucuit 113, the following table indicates which control function signals P1 and/or P2 control the operation of the flip-flops 117 and 118 for given states of the latch circits 125 and 127.

| 125 | 127 | P1 REG | P2 REG |
|---|---|---|---|
| Reset | Reset | P1 | P2 |
| Reset | Set | 0 | P1 or P2 |
| Set | Reset | 0 | P1 |
| Set | Set | 0 | 0 |

Accordingly, when latches 125 and 127 are in the reset state, the flip-flop 117 is controlled by the P1 function control signal the flip-flop 118 is controlled by the P2 function control signal. When the latch circuit 125 is reset and the latch circuit 127 is set the flip-flop 117 is not controlled by either the P1 or P2 function control signals since a low or logical "0" signal is coupled to the data input of the flip-flop. The flip-flop 118, however, is driven by either the P1 or P2 function control signals. When latch circuit 125 is set and latch circuit 127 is reset, the flip-flop 117 is not controlled by either of the P1 or P2 function control signals while the flip-flop 118 is controlled by the P1 signal, and so on. At the beginning of each day, a day pulse DP, which is generated by the clock timer circuit of the present invention, is coupled on input line 131 to gate 203 which functions as an AND gate. This signal resets each of the latch circits 125, 127 and 129.

Each of the flip-flops 117-119 are reset when a fault condition exists or when the time clock of the control circuit is being set. As an example, a parity check is made of the signals in the last stage of each of the shift registers 85-98 by means of a series of EXCLUSIVE OR gates. If the parity check fails, to signal PE is generated which is coupled to latch circuit 115 which provides an output for resetting each of the flip-flops 117-119, as will be more fully explained hereinbelow. If the operating voltage for the system falls below a predetermined level, a fault signal GVD is generated which is coupled to the latch circuit 115 for resetting the function control flip-flops 117-119. Input signal $\overline{CR1}$ resets latch circuit 115 so that the system can again operate when the fault is removed. This signal is generated in a manner which will be explained more fully hereinbelow with respect to the description of the circuit of FIG. 17. The output of the latch circuit 115 is also utilized to display a zero on the time display 20. Therefore, the output of latch circuit 115 is coupled to NAND gate 135 which in turn generates a BLITES signal at the output of inverter 136 causing a display of a zero.

The time display 20 also displays a zero when the battery voltage falls below or exceeds predetermined threshold levels. The battery voltage from battery 151 illustrated in FIG. 5 is coupled to the CONV input illustrated in FIG. 6B. This voltage is coupled to the input of a two threshold level voltage detector circuit 137. When, for example, the battery voltage exceeds a predetermined negative threshold level, threshold detector circuit 137 provides an output to latch circuit 139 for setting this latch circuit. An output is accordingly provided by the latch circuit 139 for generating a BLITE signal via NAND gate 135 and inverter 136. Should the battery voltage fall below a predetermined threshold level, circuit 137 also provides a signal to latch circuit 139 for setting this circuit. Accordingly, a BLITE signal is generated by inverter 136 for generating a zero on time display 20. Thus, if the battery voltage falls either below a predetermined threshold level or rises above a second predetermined threshold level a fault condition is indicated by a zero display on the time display 20.

When the suply voltage $V_{DD}$ falls below a predetermined level, a conversion signal CON is generated which is coupled to the battery powered carry-over circuit 143. As aforementioned, this circuit is described in detail in co-pending U.S. patent application Ser. No. 707,278 filed July 21, 1976 and assigned to the common assignee herewith. Thus, by means of circuit 143 when the supply voltage $V_{DD}$ drops below a threshhold level, the relatively low battery voltage is converted to a voltage capable of driving the programmable control circuit 11 of the present invention. To drive the battery supply carry-out circuit 143, a divider circuit 163 generates a 3 kHz pulse train to intermittently turn on and off transistor 153.

When the conversion command signal CON is generated, latch circuit 145 is set to thereby generate signals PUP and $\overline{PUP}$ at the output of inverter 147. The PUP signal is low when the signal voltage $V_{DD}$ falls below a predetermined threshold level and accordingly the signal PUP is coupled to NAND gate 135 for driving the inverter 136. In addition, the signals PUP and $\overline{PUP}$ will be utilized in a manner to be described hereinbelow for controlling which time base generator, the quartz crystal oscillator or the 60 Hz line voltage, will serve to drive the clock timer of the present invention. The latch circuit 145 is reset by a REG signal on input 149 when the voltage $V_{DD}$ has been restored to its proper level. When this occurs the BLITE signal generated by inverter 136 is removed to thereby remove the zero display from the time display 20.

The 60 Hz input voltage on line 70 is converted to a square wave signal by means of flip-flop 150. In addition, the 60 Hz input signal after being converted to a square wave is converted to a 60 Hz pulse train at output terminals 152 and 154 in a conventional manner as illustrated in FIG. 6B. These signals will be utilized in the timing circuit and the output control circuits to be explained more fully hereinbelow.

Figure 7:
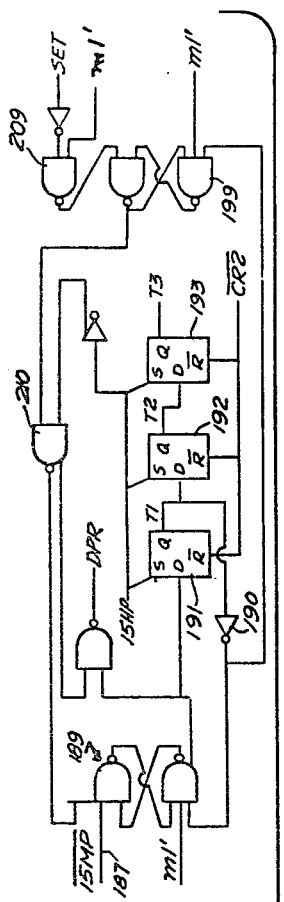
FIG. 7 is a schematic diagram of the control circuitry of the present invention.
Figure 8:
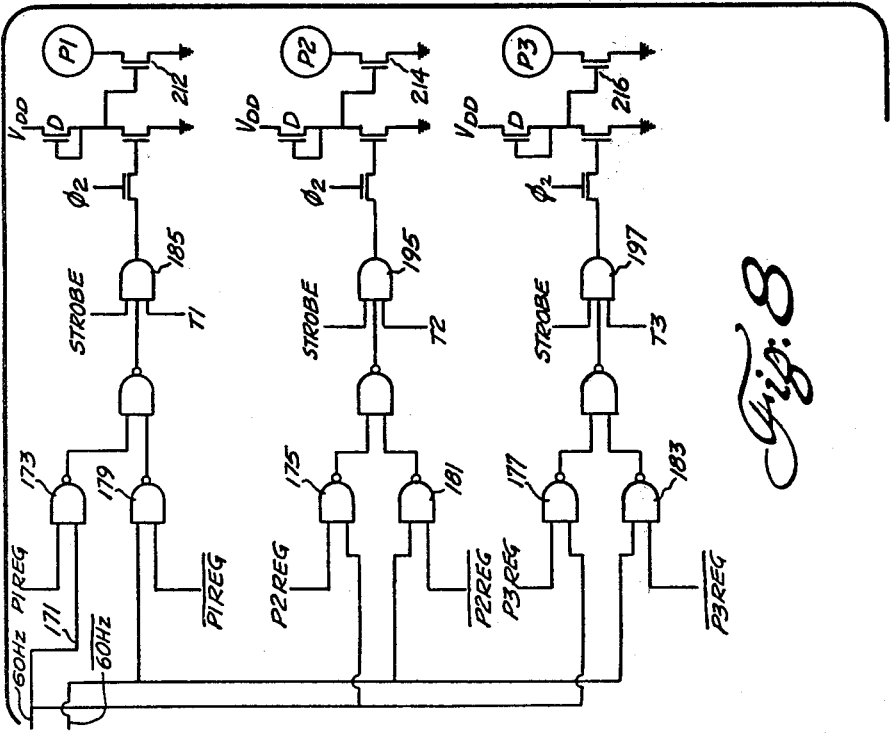
FIG. 8 is a schematic diagram of the control circuitry of the present invention.

Referring now to FIGS. 7 and 8 where there is disclosed the circuitry for timing the generation of pulses for driving the transistors 73, 75 and 79 which as aforementioned provide gating signals to the Triacs 69, 71 and 77, respectively. It will be recalled that the bistable clutches are each in one of two stable positions, therefore, current flow through the solenoid windings of the clutches will change the positions of each of the clutches if in a first direction but will not effect the position of the clutches if in a second direction. To control the positions of the clutches, the half cycle of the 60 cycle A.C. voltage in which the Triacs are gated must be controlled. This is accomplished by the circuitry of FIG. 8. With reference to FIG. 8, the $\overline{P1 \text{ REG}}$ output of function control flip-flop 117 is connected to one input of NAND gate 173 while the P1 REG output of flip-flop 117 is coupled to one input of NAND gate 179. These signals determine which state the clutch gear assembly 53 will be in. Depending upon the value of the output signals P1 REG and $\overline{P1 \text{ REG}}$ of the flip-flop 117, either gate 173 or gate 179 is enabled. With gate 173 enabled, an in-phase signal, 60 Hz, is coupled to a sequence control gate 185. With gate 179 enabled, an out-of-phase signal, $\overline{60 \text{ Hz}}$, is coupled to the gate 185. Thus, when gate 173 is enabled, the triac 69 is gated during a positive half cycle of the 60 cycle A.C. drive voltage and when gate 179 is enabled the triac is gated during the negative half cycle of the 60 cycle A.C. line voltage. Consequently, the gates 173 and 179 are controlled in accordance with the output of function control flip-flop 117 to control which cycle of the 60 Hz A.C. voltage will be gated by the triac 69 through the solenoid coil 59 illustrated in FIG. 5. The direction in which current is gated through the solenoid winding 59 is determinative of whether the bistable clutch gear assembly 53 will either remain at the present state or switch to a new state.

In the same manner as aforementioned, NAND gates 175 and 181 control the half cycle in which triac 71 is gated to permit current flow through solenoid winding 65 of the clutch mechanism 67. Finally, NAND gates 177 and 183 control the half cycle during which triac 77 is gated to permit current flow through solenoid winding 68 of the load control switch 21.

In order to limit the maximum current flow from transformer 58 of FIG. 5, the gating of the triacs 69, 71 and 77 is controlled to occur in an ordered sequence during the beginning of each 15 minute interval wherein none of the triacs are gated simultaneously. The AND gates 185, 195 and 197 provide a means for timing the operation of the triacs in a sequential manner one after another in accordance with the sequenced time control signals T1, T2 and T3, respectively. The sequence time control signals T1, T2 and T3 are generated by a sequence timing control circuit illustrated in FIG. 7.

With reference to FIG. 7, at the beginning of each 15 minute interval, a pulse signal is coupled on line 187 to latch circuit 189 to set this circuit. With latch circuit 189 set a logic "1" high signal is coupled to the data input of flip-flop 191. This signal is clocked through the flip-flop 191 by means of a 15 Hz (15 HP) pulse signal generated by the clock timer of the present invention. The timing control signal T1 at the Q output of flip-flop 191 is coupled back to the reset input of latch circuit 189 via inverter 190. In addition, the T1 signal is coupled to one input of AND gate 185 illustrated in FIG. 8. Thus, the timing control signal T1 goes high for one clock pulse period of the 15 Hz clock pulse coupled to the flip-flop 191. The output T1 of flip-flop 191 is coupled to the data input of flip-flop 192 with this signal being passed therethrough by means of the 15 Hz clock (15 HP). Thus, sequence timing control signal T2 is generated immediately after the completion of the signal T1 with the signal T2 having a duration of one 15 Hz clock period. This signal is coupled to one input of AND gate 195. Following the generation of the timing control signal T2, this signal is clocked through flip-flop 193 to thereby generate a third timing control signal T3 which exists for one 15 Hz clock pulse period. Thus, the AND gates 185, 195 and 197 of FIG. 8 are each enabled sequentially one after another.

As will be explained more fully hereinbelow when the timing circuit of the present invention is being set or data is being read into the recirculating shift registers, a signal ml' is generated by the program control circuit illustrated in FIG. 17. This signal is applied to the reset input of latch circuit 189 to prevent the gating of the triacs 69, 71 and 77 since AND gates 185, 195 and 197 will be inhibited without the generation of sequence control signals T1, T2 and T3.

Immediately after the clock timer of the present invention has been set, it is desired that the clutches and the load control switch each be actuated to their desired state, i.e., either engaged or disengaged. To accomplish this the ml' signal from the program control circuit of FIG. 17 is coupled to one input of NAND gate 209. At the same time because the $\overline{SET}$ signal does not go high until a short time after ml' signal goes high, NAND gate 209 generates a low signal which is coupled to the set input of latch circuit 199. This signal occurs immediately after the timer of the present invention has been set. Latch circuit 199 provides a high signal at its output which is coupled to NAND gate 210. NAND gate 210 generates a low output signal in response thereto which is coupled to the set input of the latch circuit 189. With latch circuit 189 set, flip-flops 191, 192 and 193 provide sequence control pulses T1, T2 and T3 for sequentially enabling AND gates 185, 195 and 197 in FIG. 8. Thus, after the clock timer has been set each of the clutch mechanisms and the load control switch are set in accordance with the present output of function control flip-flops 117, 118 and 119. When flip-flop 191 generates the sequence control signal T1, this signal is coupled back via inverter 190 to the reset input of latch circuit 199 to reset the latch circuit. During the time that the clock timer of the present invention is being set, the signal ml' is coupled to the reset input of latch circuit 189 and 199 in order to prevent generation of gate enabling signals T1, T2 and T3 for enabling AND gates 185, 195 and 197.

Referring now back to FIG. 8, it will be recalled that the power supply voltage is a full wave rectified non-filtered voltage and the voltage for driving the solenoids of the clutch assemblies and load control switch is a 60 Hz A.C. voltage. In order to insure that the time at which the triacs 69, 71 and 77 are gated is not during the time in which the power supply voltage or the 60 cycle A.C. voltage approaches zero, a STROBE signal is coupled to each of the gates 185, 195 and 197 to enable these gates for a fixed period of time during each half cycle of the input A.C. voltage. The STROBE signal can be generated by any conventional means known in the art.

When one of the gates 185, 195 or 197 provides an output, a corresponding one of the transistors 212, 214 or 216 is turned on to thereby connect the base terminals of drive transistors 73, 75 or 79 to ground. When this occurs the corresponding triacs 69, 71 or 77 are gated to thereby permit current flow through the solenoids of the clutch mechanisms or the load control switch.

Figure 9:
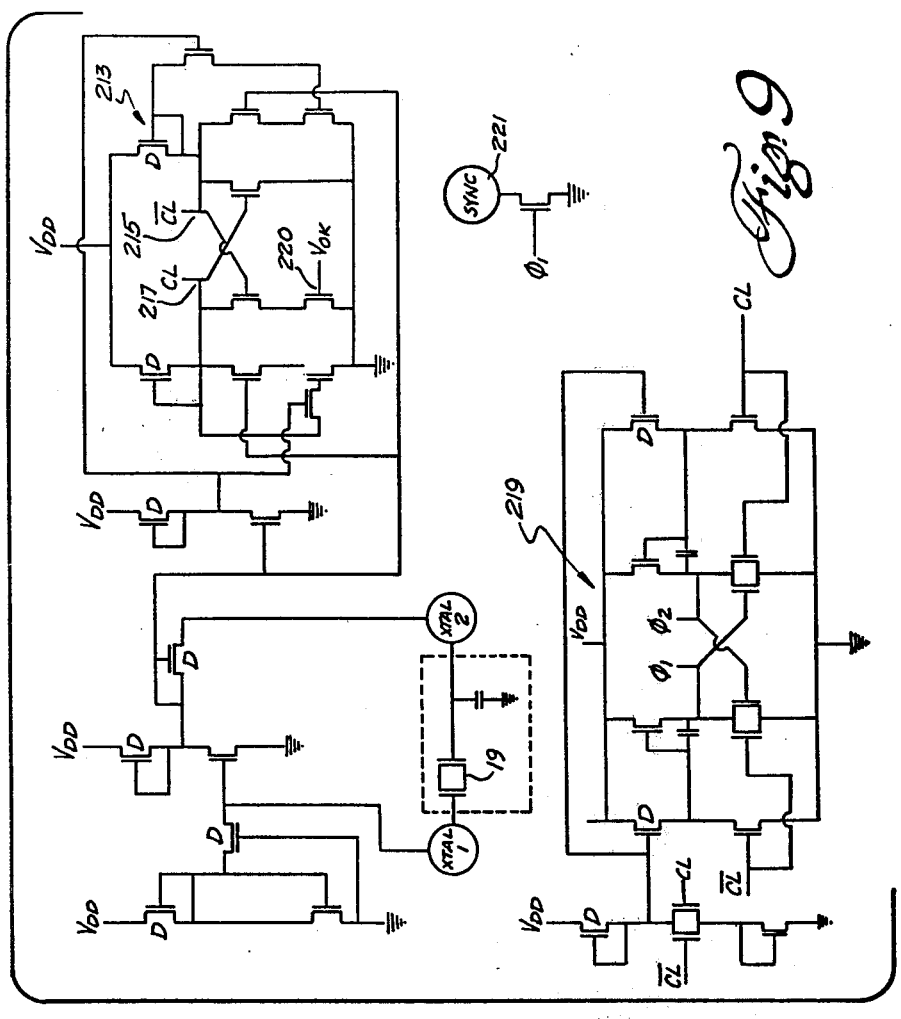
FIG. 9 is a schematic diagram of the clock oscillator of the present invention.

A detailed description will now be presented of the operation of the clock timer circuit of the present invention. As aforementioned, either a 60 Hz line voltage time base may be utilized or in the alternative, the oscillator including quartz crystal 19 may be utilized. Illustrated in FIG. 9 is the quartz crystal oscillator circuit utilized in the preferred embodiment of the present invention. The oscillator circuit is described in detail in copending application Ser. No. 707,275, filed July 21, 1976, which is assigned to the common assignee herewith. This quartz crystal oscillator utilizes a minimum of power to thereby enable operation of the metering system for extended periods of time solely from battery power. The output of the oscillator is coupled to a divider circuit 213 which provides as an output a 16 kHz clock pulse signal $\overline{CL}$ at terminal 215 and at terminal 217 a 180° out-of-phase clock pulse signal (CL) having the same frequency. These signals are coupled to a pulse forming circuit 219 which generates two sync pulses $\phi 1$ and $\phi 2$ each having a frequency of 16 kHz. $\phi 1$ and $\phi 2$, which are phase shifted with respect to one another by 180°, are utilized as sync pulses for synchronizing the operation of the two phased dynamic ratio less logic circuitry of the time of day meter and in addition provide a sync output at terminal 221 for synchronizing the operation of a means for setting the time and reprogramming the time of day meter of the present invention.

Figure 12:
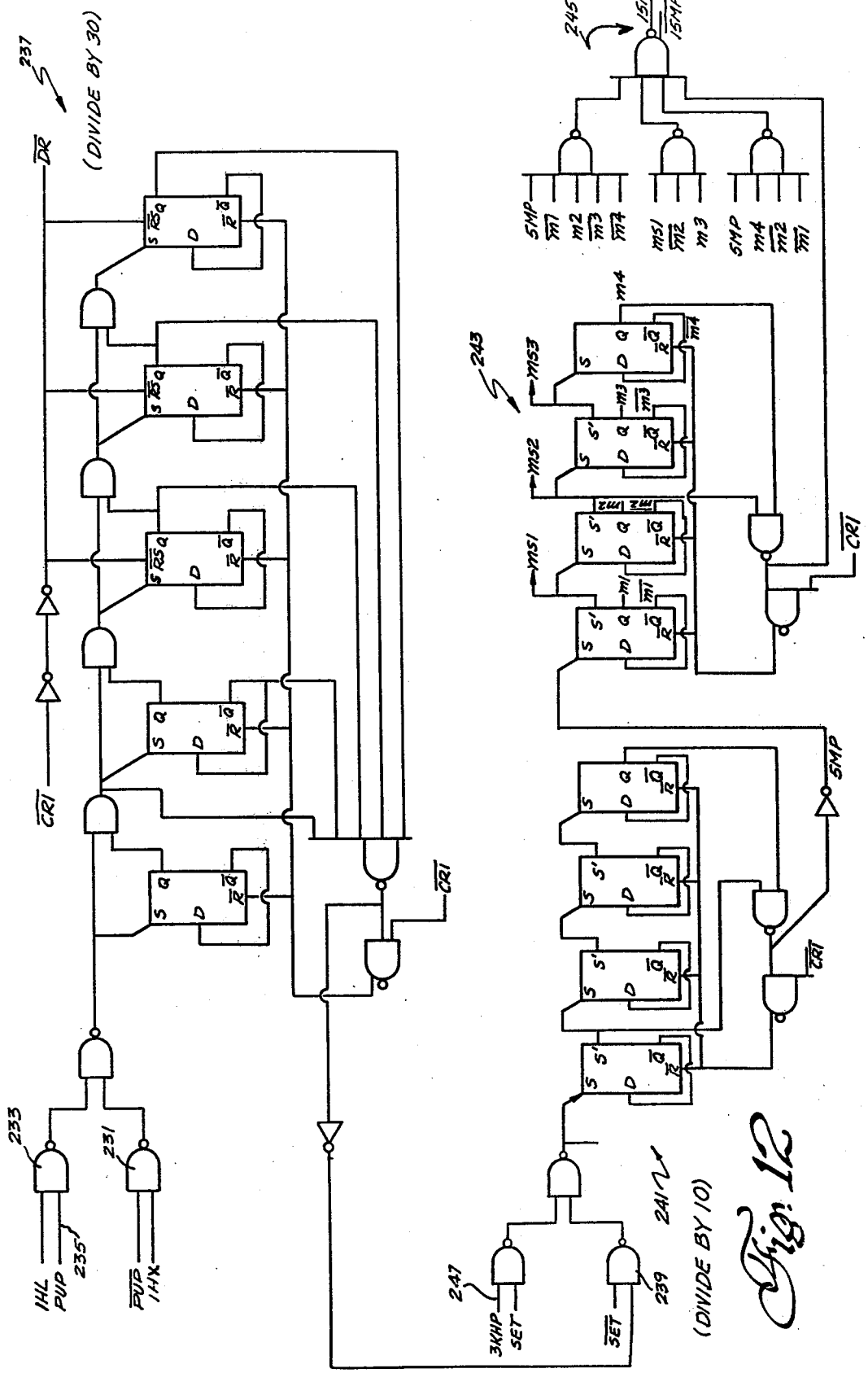

Should the power supply voltage $V_{DD}$ drop below a predetermined level, a $\overline{VOK}$ signal is generated, which is coupled to transistor 220. In response thereto, the divider circuit 213 is inhibited to thereby prevent operation of the time of day meter of the present invention. FIGS. 10 and 11 show divider circuits for converting the 16 kHz signal to a 1 Hz signal designated 1HX, and for converting the 60 Hz signal to a 1 Hz signal, designated 1HL, respectively. These circuits operate in a conventional manner to divide down the respective input signals and accordingly will not be explained in detail herein. The 1 Hz output, i.e., 1HX, of the divider of FIG. 10 is coupled to one input of NAND gate 231 shown in FIG. 12 and the 1 Hz output of the divider of FIG. 11, i.e., 1HL, is coupled to one input of NAND gate 233. The other inputs of these NAND gates are derived from the output of inverter 147 illustrated in FIG. 6B. As aforementioned, the inverter 147 provides an output when a fault condition appears on the input line voltage thereby necessitating control of the timing function of the control circuit 11 by means of the quartz crystal oscillator circuit. Thus, when a signal appears at input 235, gate 233 is inhibited while the inverse of this signal is coupled to NAND gate 231 to enable this gate to thereby connect the 1HX signal from the divider of FIG. 10 to the divider 237. If the 60 Hz input voltage is being utilized as a time base, NAND gate 231 is inhibited and NAND gate 233 is enabled to thereby connect the 1HL signal from the divider circuit of FIG. 11 to the divider 237. The divider 237 divides by 30, and accordingly, the output of divider 237 is a pulse which occurs every half minute. This signal is coupled to a gating circuit 239 which is normally enabled to couple the output of divider 237 to a second divide by 10 divider circuit 241. The divide by 10 circuit 241 provides an output pulse to another divider 243 once every five minutes. Divider circuit 243 provides an output pulse every fifteen minutes at output terminal 245.

If a test or time setting operation is desired, a programmer is connected to the time of day metering system of the present invention. When this occurs a $\overline{SET}$ signal is coupled to gate 239 to thereby inhibit the output of divider 237 and enable a 3 kHz pulse train (3 KHP) to be coupled via input terminal 247 to the divider 241. This effectively speeds up the operation of the time of day meter so that the test and time setting functions can be more rapidly completed. The flip-flops of dividers 241 and 243 each have an S' output. Since the flip-flops are gated by a pulse, rather than by the leading or trailing edge of a signal, a pulse must be generated. This is accomplished by an AND gate connected across the input S and the Q output of each flip-flop in the manner illustrated in divider 237. The S' output of the flip-flops of the dividers 241 and 243 is the output of the (undepicted) pulse forming AND gates.

Figure 14:
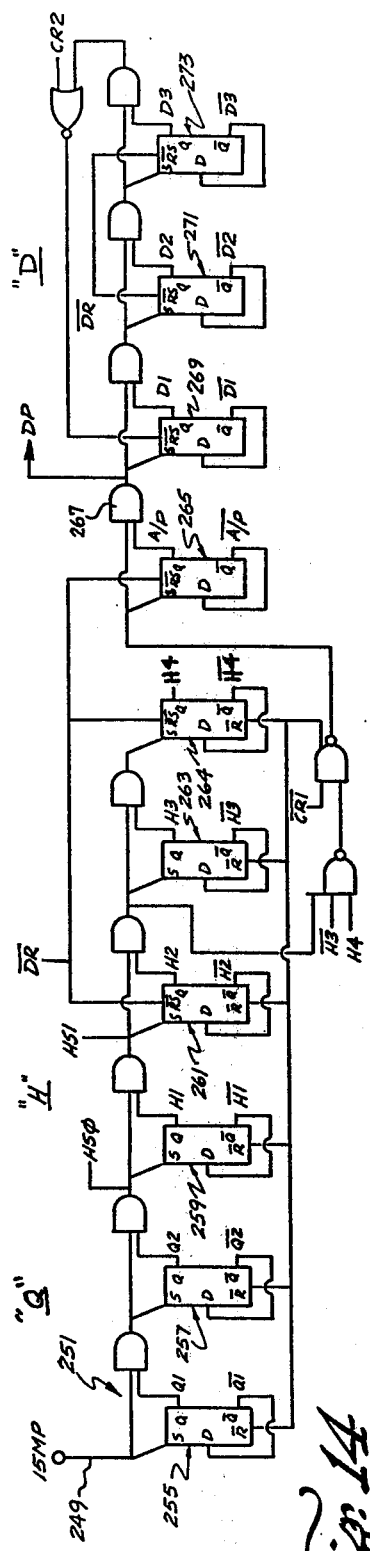
FIG. 14 is a schematic diagram of another portion of clock timer circuits.

Refer now to FIG. 14 where there is disclosed a counter circuit for generating the binary signals for designating the quarter hour segments (Q) of an hour, the hours (H) of a day and the days (D) of a week. Input line 249 couples the fifteen minute pulse from output line 245 of FIG. 12 to the input of the counter circuit 251 illustrated in FIG. 14. This signal is effectively divided by each of the flip-flops illustrated to provide in binary form the appropriate output signals for designating the time segment in which the time of day meter is operating. Thus the outputs of flip-flop 255 and flip-flop 257 provide $\overline{Q1}$ and $\overline{Q2}$ outputs which outputs are coupled to the EXCLUSIVE OR gates 101 of recirculation registers 85 and 86. These two signals define each quarter hour segment of each hour of the day. The outputs of flip-flops 259, 261, 263 and 264 define the twelve hours of each half day. These signals are connected to the comparison gates at the outputs of recirculation registers 87, 88, 89 and 90 illustrated in FIG. 6A. Flip-flop 265 defines which half of the day the meter is operating in, e.g., the A.M. or P.M. The output of this flip-flop is connected to the comparison gate at the output of shift register 91 of FIG. 6A. The output of this flip-flop is also coupled to an AND gate 267, the output (DP) of which is connected to gate 203 to reset the latches 125, 127 and 129 of FIG. 6B. In addition, the output of AND gate 267 is further divided by flip-flops 269, 271 and 273 to provide signals $\overline{D1}$, $\overline{D2}$ and $\overline{D3}$ for defining the day of the week. These signals are coupled to the output gates of shift registers 92, 93 and 94, respectively.

As aforementioned, the time display 20 is a seven segment single digit display and accordingly in order to provide time information, the day, hour, and minute display must be done on a sequential basis. Accordingly, the output of the clock timer circuit illustrated in FIG. 14 must be appropriately multiplexed in order to control the time at which the days, hours and minute signals are coupled to the display. In the preferred embodiment the display operates on a 16 second cycle. During the first 6.5 seconds of the cycle, the display 20 is blanked to thereby provide a well defined interval for indicating when a new time display begins. After such a 6.5 second blanking period has terminated a zero is displayed for one-half a second to indicate the start of a time display. After the zero has been displayed for half a second, a half second blanking interval occurs followed by a half second display of a numeral indicating the day of the week. After the day of the week has been displayed numerically, a 2.5 second blanking interval exists followed by a 1.5 second display of the hour of the day. Since the hour display may require two digit displays, the tens digit is displayed first, followed by a half second blanking interval which in turn is followed by a half second display of the units digit of the hour of the day. After the hours of the day have been displayed, a 2.5 second blanking interval exists followed by a 1.5 second interval for displaying the minutes of the hour. The minutes of the hour are displayed in five minute intervals.

Figure 13:
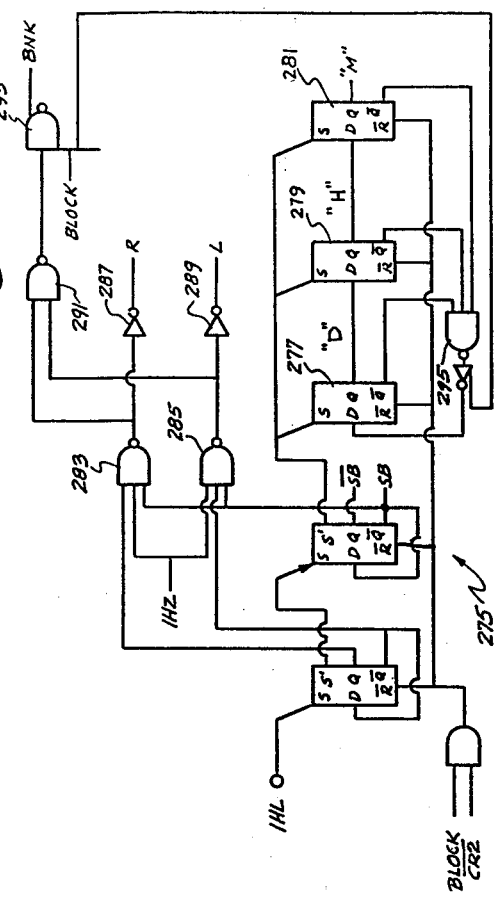
FIG. 13 is a schematic diagram of a portion of the preferred embodiment of the output control circuitry of the programmable control circuit of the present invention.

Refer now to FIG. 13 where there is disclosed a circuit for generating control signals necessary for timing the operation of the display 20 in accordance with the aforementioned timed sequence. A 1 Hz input (1 HL) signal is coupled to a divide by 4 divider 275. The output of divider 275 is coupled to each of the flip-flops 277, 279 and 281. These flip-flops provide pulses for enabling the display of the day of the week, the hours of the day and the minutes of the hour, respectively. Thus, flip-flop 277 provides an enabling output (D) during a first 4 second time segment, flip-flop 279 provides an enabling output (H) during a second succeeding 4 second time segment and flip-flop 281 provides a third enabling output (M) during a third succeeding 4 second time interval. A 1 Hz input signal is also coupled to a set of NAND gates 283 and 285. Also coupled to NAND gate 283 is a one-half Hz output signal from the first stage of divide by 4 divider 275 and a one-fourth Hz output from the $\overline{Q}$ output of the second stage of the divider 275. Also coupled to NAND gate 285 is the $\overline{Q}$ output signals from the first and second stage of the divider 275. The outputs of the NAND gates 283 and 285 are inverted by inverters 287 and 289 and are utilized to define the half-second time slots during which the day of the week, hour of the day and minutes of the day signals are displayed on the display 20. The outputs of NAND gates 283 and 285 are coupled to a second NAND gate 291, and to a blanking NAND gate 293.

Also coupled to NAND gate 293 is the output of NAND gate 291. NAND gate 293 provides a blanking signal (BNK) during a fourth four second interval of each time display interval or cycle and blanking between digits.

Figure 15:
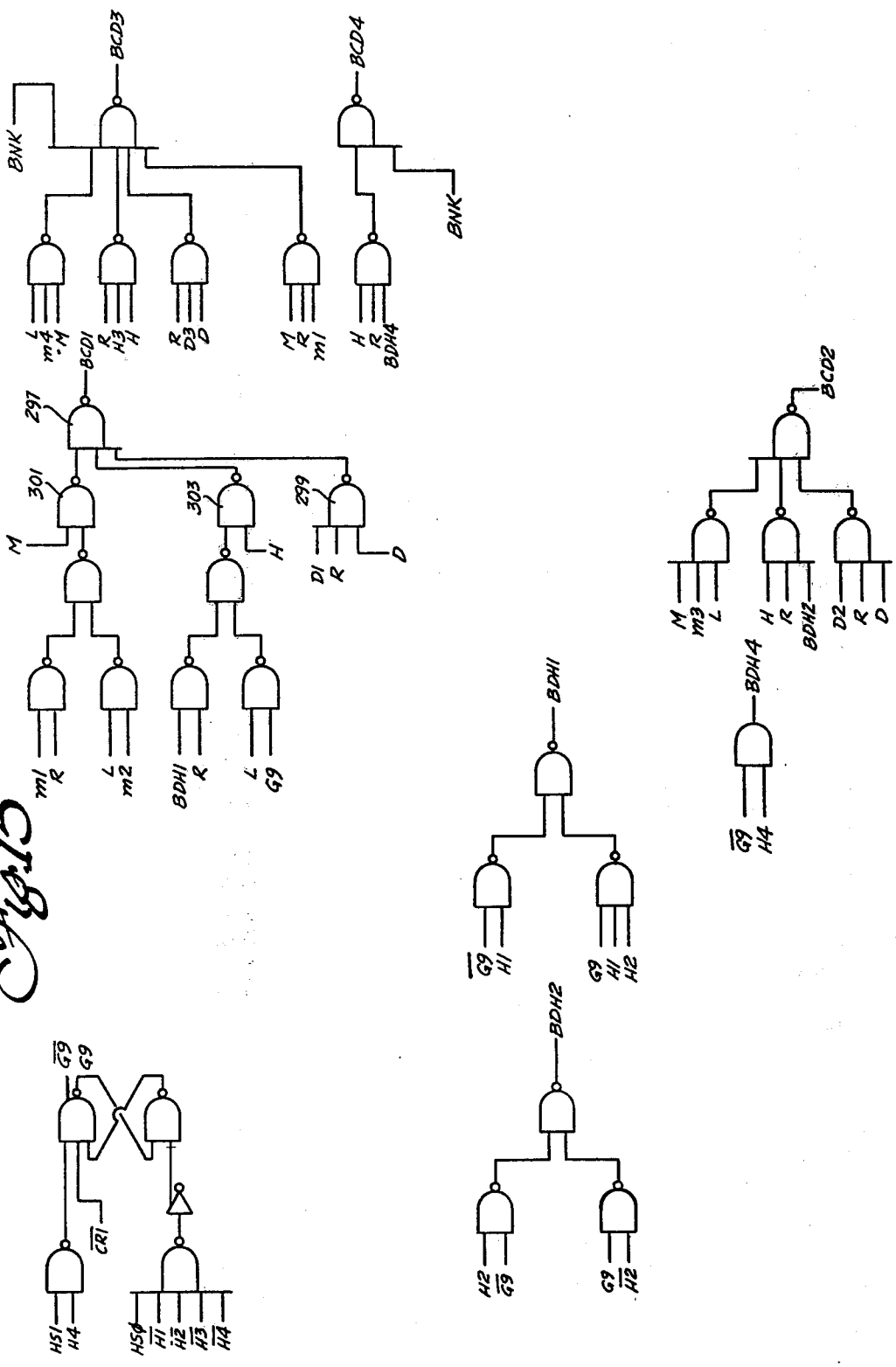
FIG. 15 is a schematic diagram of another portion of the output control circuitry.

As aforementioned, the time display signals must be appropriately time multiplexed so that the day of the week, the hour of the day and the minutes of the hour are displayed in sequence on the display unit 20. In order to provide this multiplexing function, a series of logic gates are illustrated in FIG. 15. Thus, for example, the output of NAND gate 297 provides a binary coded decimal signal (BCD1) for the first output terminal D1 of the control unit 11. This NAND gate provides in sequence signals which when combined with the signals at output terminals D2–D4 define the day of the week, the hour of the day and the minutes of the hour. The day of the week signals are coupled to NAND gate 297 from NAND gate 299. Coupled to NAND gate 299 is the output (D) of flip-flop 277, the output of inverter 287, both illustrated in FIG. 13, and the day signal output D1 which appears at the Q output of flip-flop 269 of FIG. 14. These signals define in a half-second time slot, the first binary coded digit position of the day of the week signal which is coupled to the display unit 20 through decoder driver 18. NAND gates 301 and 303 provide at their outputs multiplexed binary coded decimal information for the first digit position of the time display signal for the minutes of the day and hours of the day, respectively. The other inputs to the various gates of the multiplexing circuit of FIG. 15 are derived from the various outputs of the timer circuit of FIG. 14 and the multiplex signal generator circuit of FIG. 13. Since the operation of the complete logic circuits of FIG. 15 is evident from the Figure, a detailed description thereof will not be provided herein.

Figure 16:
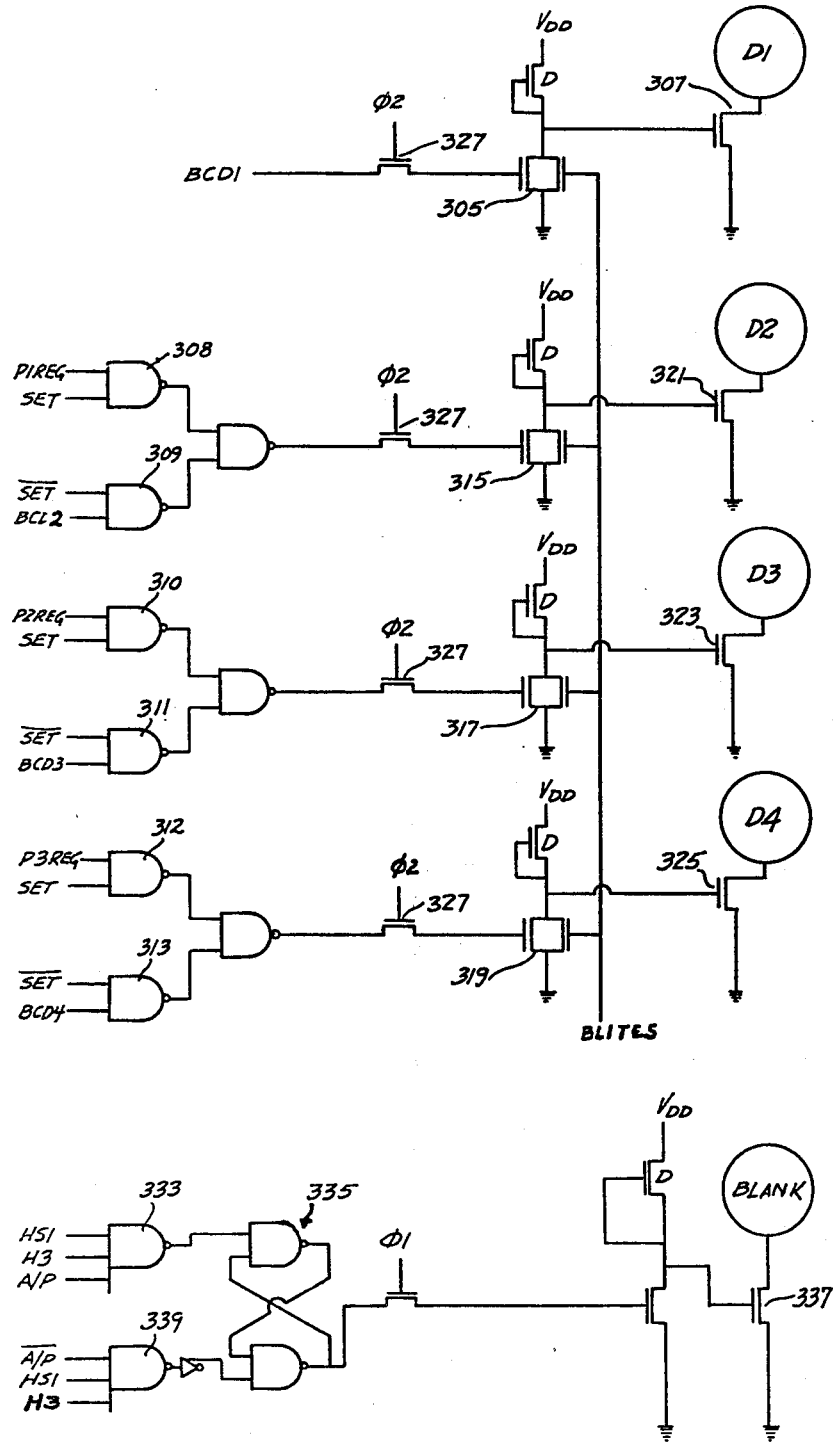
FIG. 16 is a schematic illustration of the output drive circuits for the display drive of the present invention.

Refer now to FIG. 16 where there is disclosed a driver circuit for generating the BCD signals D1–D4 as well as a blanking signal to the decoder driver circuit 18. The output (BCD1) of NAND gate 297 of FIG. 15 is connected to a gating circuit 305. The output of circuit 305 is turn drives output transistor 307 to provide an appropriate signal at output D1. The second through fourth BCD outputs of the multiplexing circuit in FIG. 15 are connected to NAND gates 309, 311 and 313, respectively. These signals are coupled to gating circuits 315, 317 and 319, respectively, when the time of day circuit is not in its set mode, i.e., when the time of day metering system is operating under normal conditions. The outputs of circuits 315, 317 and 319 are then coupled to driver transistors 321, 323 and 325, respectively, to provide output signals at terminals D2, D3 and D4, respectively.

When the system is under a test condition, NAND gates 309, 311 and 313 are inhibited and NAND gates 308, 310 and 312 are enabled. With these gates properly enabled, the outputs of the function control flip-flops 117, 118 and 119, respectively are coupled to gates 308, 310 and 312, respectively. The P1 REG, P2 REG and P3 REG outputs of functions control flip-flops 117–119 are connected to a programmer (e.g., 23) via connector 30 illustrated in FIG. 2 for the purpose of verifying the correct operation of the metering system.

As aforementioned, since the present invention utilizes two phase dynamic ratioless logic, the 16 kHz $\phi 2$ signal is coupled to DC converter transistors 327 to provide a DC drive signal for the gating transistors 305, 315, 317 and 319. Finally, as aforementioned, when a fault condition exists, NAND gate 135 of FIG. 6B provides an output signal (BLITES) for displaying a zero on display unit 20. This signal is coupled to the gating circuits 305, 315, 317 and 319 and in effect overrides any output signals coupled thereto from the multiplexing circuit 315 of FIG. 15 of the function control flip-flops 117-119 of FIG. 6B.

It is desired that the time display be blanked during the night time hours, i.e., 6:00 PM to 6:00 AM. Thus, the AM-PM time signal at the Q output of flip-flop 265 of the timing circuit in FIG. 14, the hour signal from the Q output of flip-flop 263 and the HS1 signal coupled to the input of flip-flop 261 are coupled to NAND gate 333. This signal sets latch circuit 335 to thereby cause a blanking signal (BLANK) to be generated at the output of drive transistor 337. The AM-PM signal $\overline{A/P}$ from the Q output of flip-flop 265 is coupled to a second reset NAND gate 339 together with the two hour signals from flip-flops 263 and 261. These signals reset latch circuit 335 to thereby remove the blanking signal from the blanking output transistor 337. Thus, the display is blanked during the time period between 6:00 PM and 6:00 AM. Referring briefly back to FIG. 5, the decoding circuit 18 receives the aforementioned blanking signals together with the binary coded decimal output signals D1-D4 and appropriately converts these signals in a known manner to drive the seven segment digit display 20. Should it be desired to display a time signal during the time period between 6:00 PM and 6:00 AM, a magnet can be utilized to close reed switch 341 to thereby remove the blanking a signal from the decoder 21. Thus, a means is provided for displaying time signals during the night time hours.

It should be understood that other time display arrangements could be utilized if desired. For example, it is not necessary that a single digit display arrangement be utilized but rather a multiple digit display could be utilized to simultaneously display the day of the week, the hours of the day and the minutes of the hour. The present system is utilized because of confining space requirements and the desirability of decreased costs.

Figure 17:
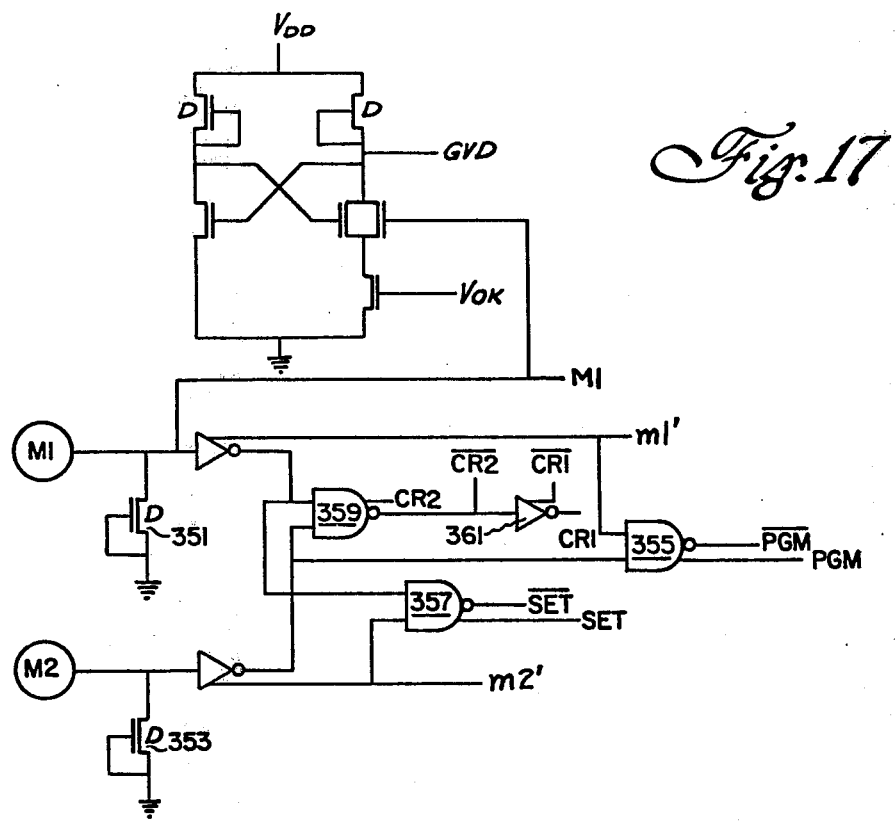
FIG. 17 is a schematic illustration of the interface control circuit.

Refer now briefly to FIG. 17 where there is disclosed an interface circuit for controlling the operation of the time of day metering system in accordance with the commands from a programmer circuit. It will be recalled that the signals received from the programmer are the data signals which are coupled to the recirculating shift registers illustrated in FIG. 6A and two circuit control signals M1 and M2. Signals M1 and M2 when taken together define the mode of operation of the time of day meter in accordance with the following table:

| M1 | M2 | |
|----|----|----|
| 1 | 1 | NORMAL RUN |
| 1 | 0 | PROGRAM |
| 0 | 1 | SET |
| 0 | 0 | RESET |

Thus, when M1 and M2 are both high, the time of day metering system operates in its normal mode of operation. However, when the M2 input goes low, a program is read into the recirculating memory of FIG. 6A. The set and reset modes are for the purpose of setting the time of the time of day meter and testing the metering system.

Referring now to FIG. 17, input transistors 351 and 353 normally maintain the inputs M1 and M2 high whenever the portable programmer is not connected to the time of day metering system. Thus, without the portable programmer connected in circuit, the time of day metering system operates in its normal mode. Thus, the signal M1, which is used for example in the circuit of FIG. 7, is normally high. When a program mode is established by the portable programmer, the M2 input goes low, thereby causing NAND gate 355 to provide a high output at the PGM output thereof and a low output at the $\overline{PGM}$ output thereof. These signals are utilized to gate the data information from the portable programmer into the shift registers of FIG. 6A. When the portable programmer establishes a set mode of operation, NAND gate 357 generates a high signal at the SET output thereof and a low signal at the $\overline{SET}$ output thereof. These signals are utilized to control the sequence circuit of FIG. 7, the timer circuit of FIG. 12 and the display drive circuit of FIG. 16. Finally, when the portable programmer establishes a reset mode of operation, both inputs M1 and M2 are low and accordingly, the CR2 output of NAND gate 359 goes high as does the CR1 output of inverter 361. These signals are utilized throughout the circuitry of the time of day metering to appropriately reset the circuits for normal operation.

While the present invention has been disclosed in connection with a preferred embodiment thereof, it should be understood that there may be other embodiments which fall within the spirit and scope of the invention as defined by the appended claims.

What we claim as new and desire to secure by Letters Patent of the United States is:

1. A multiple rate electrical energy metering system for registering the total electrical energy consumed and the electrical energy consumed during preselected time intervals comprising:

a first means for continuously registering the consumption of electrical energy, said means including a plurality of dial pointers, said dial pointers being driven by a set of decade gears, said decade gears being driven in accordance with the electrical energy being consumed, at least one alternate means for registering the consumption of electrical energy during said preselected time intervals, said at least one alternate registering means comprising a plurality of dial pointers and decade gear means for driving said dial pointers, a clock means for generating real time signals, a recirculating storage means for storing a plurality of time data signals corresponding to a plurality of predetermined times and for storing a plurality of function data signals corresponding to control functions to be performed at said predetermined times, a comparator means for periodically comparing said real time signals with each of said time data signals, logic means responsive to said comparator means and said recirculating storage means for generating a function control signal when a comparison of said real time signals and said time data signals exists, said function control signal corresponding to said function data signals in time coincidence with said compared time data signals, and clutch means responsive to said logic means for engaging or disengaging said at least one alternate registering means in accordance with said function control signal, said clutch means including a first gear means continuously driven by the decade gears of said first means for continuously registering, a second gear means in continuous engagement with the decade gears of said at least one alternate means for registering, and means responsive to said function control signal for selectively engaging and disengaging said second gear means with said first gear means.

2. The multiple rate electrical energy metering system of claim 1 wherein said clutch means is bistable and comprises a magnetizable material fixedly secured to said first gear means, a permanent magnet fixedly secured to said second gear means, a solenoid, said solenoid being energized by said function control signal to induce a magnetic field in said magnetizable material in a first or second direction, said permanent magnet and said second gear means being engaged with said magnetizable material and said first gear means when said solenoid generates a magnetic field in a first direction and said permanent magnet and said second gear means being disengaged from said magnetizable material and said first gear means when said solenoid generates a magnetic field in a second direction, the brake means for fixedly securing said second gear means said permanent magnet is disengaged from said magnetizable material.

3. A multiple rate electrical energy metering system for registering the total electrical energy consumed and the electrical energy consumed during preselected time intervals from a power distribution system comprising:
   a first means for continuously registering the consumption of electrical energy,
   at least one alternate means for registering the consumption of electrical energy during said preselected time intervals,
   a clock means for generating real time signals, said clock means including means for deriving a time base signal from said power distribution system, a low power oscillator means for generating a second time base signal, means responsive to said first or second time base signals for generating said real time signals, and time base selecting means for selectively connecting said first or said second time base signals to said real time signal generating means, a recirculating storage means for storing time data signals corresponding to a plurality of predetermined times and for storing function data corresponding to control functions to be performed at each of said predetermined times, a comparator means for periodically comparing said real time signals with each of said stored time data signals, logic means responsive to said comparator means and said recirculating storage means for generating a function control signal when a comparison of said real time signals and said stored time data signals exist, said function control signal corresponding to the stored function data in time coincident with said compared time data signals, and means responsive to said logic means for engaging or disengaging said at least one alternate registering means in accordance with said function control signal.

4. The multiple rate electrical energy metering system of claim 3 wherein said time base selecting means normally connects said first time base from said distribution system to said means for generating real time signals and is responsive to a fault condition in said distribution system to connect said second time base signal to said means for generating real time signals.

5. The multiple rate electrical energy metering system of claim 3 further comprising time display means for displaying the real time.

6. The multiple rate electrical energy metering system of claim 5 wherein said time display means comprises a single digit display means, and multiplexing means for sequentially displaying the real time in the order of the most significant time digit to the least significant time digit.

7. The multiple rate electrical metering system of claim 6 wherein said multiplexing means comprises means for blanking said time display means for a predetermined period of time, and for displaying in sequence the day of the week, and the time of day.

8. The multiple rate electrical energy metering system of claim 5 wherein said logic means responsive to said comparator means and said recirculating storage means includes means for generating a plurality of function control signals for each of a plurality of alternate means for registering the consumption of electrical energy during preselected time intervals and means responsive to said logic means for sequentially engaging or disengaging each of said alternate registering means in accordance with said function control signals in a timed sequence, said sequential engaging and disengaging means limiting the instantaneous power drain from said metering system.

9. The multiple rate electrical energy metering system of claim 5 further comprising a power supply for converting the voltage of said power distribution system to a DC voltage for driving said metering system, means for detecting the level of voltage for driving said metering system and means responsive to a decrease of said voltage level below a predetermined level for connecting a battery power supply to said metering system.

* * * * *